(12) United States Patent
    Choi et al.

(10) Patent No.: US 12,219,814 B2
(45) Date of Patent: Feb. 4, 2025

(54) DISPLAY DEVICE HAVING TRANSMISSION AREA AND ELECTRONIC APPARATUS HAVING THE SAME

(71) Applicant: SAMSUNG DISPLAY CO., LTD., Yongin-si (KR)

(72) Inventors: Nakcho Choi, Yongin-si (KR); Daegi Kweon, Yongin-si (KR); Minyeul Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 18/146,335

(22) Filed: Dec. 23, 2022

(65) Prior Publication Data

US 2023/0128710 A1  Apr. 27, 2023

Related U.S. Application Data

(63) Continuation of application No. 17/001,256, filed on Aug. 24, 2020, now Pat. No. 11,538,880.

(30) Foreign Application Priority Data

Feb. 7, 2020  (KR) .................. 10-2020-0015204

(51) Int. Cl.
    *H01L 29/08*   (2006.01)
    *H10K 59/121*  (2023.01)
    *H10K 59/65*   (2023.01)

(52) U.S. Cl.
    CPC ..... *H10K 59/1213* (2023.02); *H10K 59/1216* (2023.02); *H10K 59/65* (2023.02)

(58) Field of Classification Search
    CPC . H10K 59/1213; H10K 59/1216; H10K 59/65
    (Continued)

(56) References Cited

U.S. PATENT DOCUMENTS

| 8,436,348 B2 | 5/2013 | Ono et al. |
| 10,020,351 B2 | 7/2018 | Yang et al. |

(Continued)

FOREIGN PATENT DOCUMENTS

| CN | 110061014 A | * | 7/2019 | ............... G09F 9/33 |
| CN | 110071160 A | * | 7/2019 | |

(Continued)

*Primary Examiner* — Phuc T Dang
(74) *Attorney, Agent, or Firm* — Lewis Roca Rothgerber Christie LLP

(57) ABSTRACT

A display device includes two pixel circuits spaced apart from each other with a transmission area therebetween, a first insulating layer on the two pixel circuits, two pixel electrodes on the first insulating layer, and a second insulating layer including a first portion covering an edge of each of the two pixel electrodes and a second portion, wherein the first insulating layer includes a third portion overlapping the two pixel electrodes, and a fourth portion having a height greater than a height from the substrate to a top surface of the third portion, wherein the first portion of the second insulating layer overlaps the third portion, and the second portion of the second insulating layer overlaps the fourth portion, wherein a height from the substrate to a top surface of the second portion is greater than a height from the substrate to a top surface of the first portion.

20 Claims, 12 Drawing Sheets

(58) Field of Classification Search
USPC .......................................................... 257/40
See application file for complete search history.

(56) References Cited

U.S. PATENT DOCUMENTS

| | | |
|---|---|---|
| 10,141,377 B2 | 11/2018 | Lee et al. |
| 2004/0263056 A1 | 12/2004 | Seo et al. |
| 2015/0102320 A1 | 4/2015 | Jung |
| 2017/0330923 A1 | 11/2017 | Chung et al. |
| 2017/0355313 A1 | 12/2017 | Park et al. |
| 2018/0047790 A1 | 2/2018 | Chae et al. |
| 2018/0083217 A1 | 3/2018 | Chung et al. |
| 2018/0259852 A1 | 9/2018 | Tanigaki et al. |
| 2018/0331326 A1 | 11/2018 | Woo et al. |
| 2019/0245017 A1 | 8/2019 | Jeon et al. |
| 2020/0133040 A1 | 4/2020 | Bang et al. |

FOREIGN PATENT DOCUMENTS

| | | | | |
|---|---|---|---|---|
| JP | 5519532 B2 | 6/2014 | | |
| KR | 10-2018-0000975 A | 1/2018 | | |
| KR | 10-2018-0011982 A | 2/2018 | | |
| KR | 10-2018-0077855 A | 7/2018 | | |
| KR | 10-2020-0006647 A | 1/2020 | | |
| KR | 10-2020-0050059 A | 5/2020 | | |
| TW | 201421657 A | * | 6/2014 | ........... A61B 6/4208 |

\* cited by examiner

DISPLAY DEVICE HAVING TRANSMISSION AREA AND ELECTRONIC APPARATUS HAVING THE SAME

CROSS-REFERENCE TO RELATED APPLICATIONS

This application is a continuation of U.S. patent application Ser. No. 17/001,256, filed Aug. 24, 2020, now U.S. Pat. No. 11,538,880, issued Dec. 27, 2022, which claims priority to and the benefit of Korean Patent Application No. 10-2020-0015204, filed Feb. 7, 2020, the entire content of both of which is incorporated herein by reference.

BACKGROUND

1. Field

Aspects of one or more example embodiments relate to a display device and an electronic apparatus including the same.

2. Description of Related Art

In the field of display devices for displaying images, organic light emitting diode display devices have self-luminous characteristics, as opposed to liquid crystal display devices, which generally utilize a backlight for illumination. Thus, because organic light emitting diode display devices may not utilize a separate light source, they may generally have a relatively reduced thickness and weight compared to alternative display devices. Also, the organic light emitting diode display devices may exhibit relatively high-quality characteristics such as relatively low power consumption, relatively high luminance, and relatively high response speeds.

The above information disclosed in this Background section is only for enhancement of understanding of the background and therefore the information discussed in this Background section does not necessarily constitute prior art.

SUMMARY

The above-described organic light emitting diode display device should have high contrast and luminance but may have low contrast when external light is bright. In order to prevent or reduce this, a pixel definition layer having a certain color (e.g., black) may be formed. In the case of forming a colored pixel definition layer, a spacer should be formed on a pixel definition layer through a separate process.

In order to address aspects of the above-described issues, embodiments of some example embodiments may include a display device and an electronic apparatus including the same, which may prevent or reduce degradation of a display element with respect to external light, may reduce the noise included in information to be obtained from a component such as a camera by reducing the external light propagating to the component, and/or may simplify a process thereof. However, these problems are merely examples and the scope of embodiments according to the present the disclosure are not limited thereto.

Additional aspects will be set forth in part in the description which follows and, in part, will be apparent from the description, or may be learned by practice of the presented embodiments.

According to one or more example embodiments, a display device includes a substrate, two pixel circuits on the substrate and spaced apart from each other with a transmission area therebetween, the two pixel circuits each including a transistor and a storage capacitor, a first insulating layer on the two pixel circuits, two pixel electrodes on the first insulating layer and respectively connected to the two pixel circuits, and a second insulating layer including a first portion covering an edge of each of the two pixel electrodes and a second portion adjacent to the first portion, wherein the first insulating layer includes a third portion overlapping each of the two pixel electrodes, and a fourth portion adjacent to the third portion and having a height greater than a height from the substrate to a top surface of the third portion, wherein the first portion of the second insulating layer overlaps the third portion, and the second portion of the second insulating layer overlaps the fourth portion, wherein a height from the substrate to a top surface of the second portion is greater than a height from the substrate to a top surface of the first portion.

According to some example embodiments, the second insulating layer may include a colored pigment or a carbon black.

According to some example embodiments, each of the first insulating layer and the second insulating layer may include a hole corresponding to the transmission area.

According to some example embodiments, the display device may further include at least one inorganic insulating layer between the substrate and the first insulating layer, wherein the at least one inorganic insulating layer may include a hole corresponding to the transmission area.

According to some example embodiments, the first insulating layer may include a photosensitive organic insulating material.

According to some example embodiments, the display device may further include an opposite electrode facing the two pixel electrodes, and an intermediate layer between each of the two pixel electrodes and the opposite electrode.

According to some example embodiments, the opposite electrode may include a hole corresponding to the transmission area.

According to some example embodiments, the intermediate layer may include an emission layer overlapping each of the pixel electrodes, and a functional layer arranged under or over the emission layer.

According to some example embodiments, the display device may further include a back-side metal layer located between the substrate and the two pixel circuits.

According to some example embodiments, the back-side metal layer may include a hole corresponding to the transmission area.

According to one or more example embodiments, a display device includes a substrate, and an array of a plurality of pixels including two pixels arranged on the substrate and spaced apart from each other with a transmission area therebetween, wherein each of the two pixels includes a pixel circuit including a storage capacitor and a thin film transistor that are on the substrate, a first insulating layer on the pixel circuit, a pixel electrode on the first insulating layer and electrically connected to the pixel circuit through a contact hole of the first insulating layer, a second insulating layer including a first portion covering an edge of the pixel electrode and a second portion adjacent to the first portion, an opposite electrode facing the pixel electrode, and an emission layer between the pixel electrode and the opposite electrode, wherein the first portion and the second portion of the second insulating layer include a colored material, wherein a height from the substrate to a top surface of the second portion is greater than a height from the substrate to a top surface of the first portion.

According to some example embodiments, the first insulating layer may include a third portion overlapping the pixel electrode, and a fourth portion adjacent to the third portion and having a height greater than a height from the substrate to a top surface of the third portion, wherein a height from the substrate to a top surface of the third portion and a height from the substrate to a top surface of the fourth portion may be different from each other.

According to some example embodiments, the first portion of the second insulating layer may overlap the third portion and the second portion of the second insulating layer may overlap the fourth portion.

According to some example embodiments, the second insulating layer may include a colored pigment or a carbon black.

According to some example embodiments, each of the first insulating layer and the second insulating layer may include a hole corresponding to the transmission area.

According to some example embodiments, the display device may further include at least one inorganic insulating layer located between the substrate and the first insulating layer, wherein the at least one inorganic insulating layer may include a hole corresponding to the transmission area.

According to some example embodiments, the opposite electrode may include a hole corresponding to the transmission area.

According to some example embodiments, the display device may further include a back-side metal layer located between the substrate and the pixel circuit.

According to one or more example embodiments, an electronic apparatus includes a display device including a display area including a transmission area and a non-display area surrounding the display area, and a component arranged to overlap at least the transmission area, wherein the display device includes a substrate, a pixel circuit in the display area and including a storage capacitor and a thin film transistor on the substrate, a first insulating layer on the pixel circuit, a pixel electrode on the first insulating layer and electrically connected to the pixel circuit through a contact hole of the first insulating layer, and a second insulating layer including a first portion covering an edge of the pixel electrode and a second portion adjacent to the first portion, wherein the first portion and the second portion of the second insulating layer include a colored material, wherein a height from the substrate to a top surface of the second portion is greater than a height from the substrate to a top surface of the first portion.

According to some example embodiments, the second insulating layer may include a colored pigment or a carbon black.

According to some example embodiments, the second insulating layer may include a hole corresponding to the transmission area.

According to some example embodiments, the first insulating layer may include a third portion overlapping the pixel electrode, and a fourth portion adjacent to the third portion and having a height greater than a height from the substrate to a top surface of the third portion, wherein a height from the substrate to a top surface of the third portion may be smaller than a height from the substrate to a top surface of the fourth portion.

According to some example embodiments, the first insulating layer may include a photosensitive organic insulating material.

According to some example embodiments, the first insulating layer may include a hole corresponding to the transmission area.

According to some example embodiments, the display device may further include a back-side metal layer between the substrate and the pixel circuit.

According to some example embodiments, the component may include a camera or a sensor using light.

Other aspects, features, and characteristics of other than those described above will become apparent from the accompanying drawings, the appended claims, and the detailed description of the disclosure.

BRIEF DESCRIPTION OF THE DRAWINGS

The above and other aspects, features, and characteristics of certain example embodiments will be more apparent from the following description taken in conjunction with the accompanying drawings, in which.

DETAILED DESCRIPTION

Figure 1:
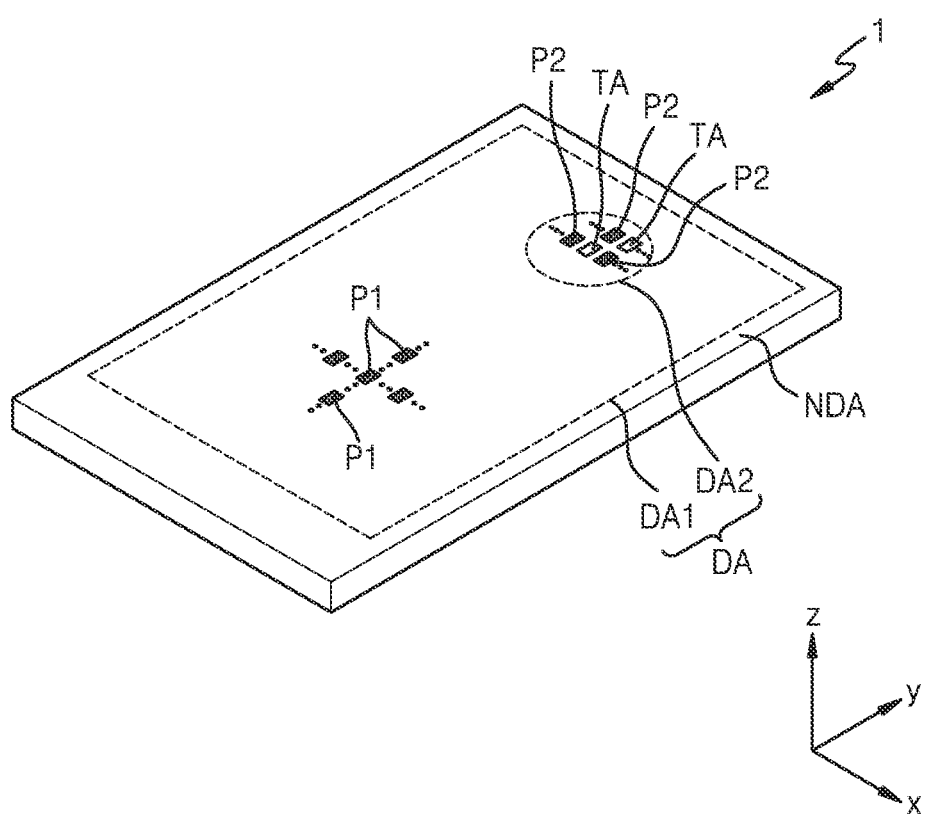
FIG. 1 is a perspective view illustrating an electronic apparatus including a display device according to some example embodiments.

Reference will now be made in more detail to aspects of some example embodiments, which are illustrated in the accompanying drawings, wherein like reference numerals refer to like elements throughout. In this regard, the present disclosure may be embodied in many different forms and should not be construed as being limited to the descriptions of the example embodiments set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, aspects of some example embodiments will be described in more detail with reference to the accompanying drawings, and in the following description, like reference numerals will denote like elements and redundant descriptions thereof will be omitted.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component or may be "indirectly electrically connected to" the other layer, region, or component with one or more intervening layers, regions, or components therebetween.

FIG. 1 is a perspective view illustrating an electronic apparatus including a display device according to some example embodiments.

Referring to FIG. 1, an electronic apparatus 1 may include a display area DA and a non-display area NDA adjacent to (e.g., around a periphery of) the display area DA. The electronic apparatus 1 may provide an image through an array of a plurality of pixels two-dimensionally arranged in the display area DA. The plurality of pixels may include first pixels P1 arranged in a first display area DA1 and second pixels P2 arranged in a second display area DA2.

The electronic apparatus 1 may provide a first image by using light emitted from a display element included in each of the first pixels P1 arranged in the first display area DA1 and may provide a second image by using light emitted from a display element included in each of the second pixels P2 arranged in the second display area DA2. The first image and the second image may be a portion of an image provided through the display area DA of the electronic apparatus 1. Alternatively, the first image and the second image may be images independent of each other.

The second display area DA2 may include a transmission area TA located between adjacent second pixels P2. The transmission area TA may be an area through which light and/or sound may pass and no pixel is arranged therein. Because the second display area DA2 includes the transmission area TA, the number of second pixels P2 per unit area may be smaller than the number of first pixels P1 per unit area.

The non-display area NDA may be an area that does not provide or display images, and no pixels may be arranged in the non-display area NDA. The non-display area NDA may entirely surround the display area DA. A driver or the like for providing an electrical signal or power to the first pixels P1 and the second pixels P2 may be arranged in the non-display area NDA. The non-display area NDA may include a pad that is an area to which an electronic device or a printed circuit board may be electrically connected.

As illustrated in FIG. 1, the second display area DA2 may have a circular or elliptical shape on a plane. Alternatively, the second display area DA2 may have a polygonal shape such as a tetragon.

The second display area DA2 may be arranged inside the first display area DA1. The second display area DA2 may be entirely surrounded by the first display area DA1. In some embodiments, the second display area DA2 may be partially surrounded by the first display area DA1. For example, the second display area DA2 may be partially surrounded by the first display area DA1 while being located at a corner portion of the first display area DA1.

The ratio of the second display area DA2 to the display area DA may be smaller than the ratio of the first display area DA1 to the display area DA. The electronic apparatus 1 may include one second display area DA2 as illustrated in FIG. 1 or may include two or more second display areas DA2.

The electronic apparatus 1 may include a mobile phone, a tablet PC, a notebook, a smart band, or a smart watch worn on a wrist.

Figure 2A:
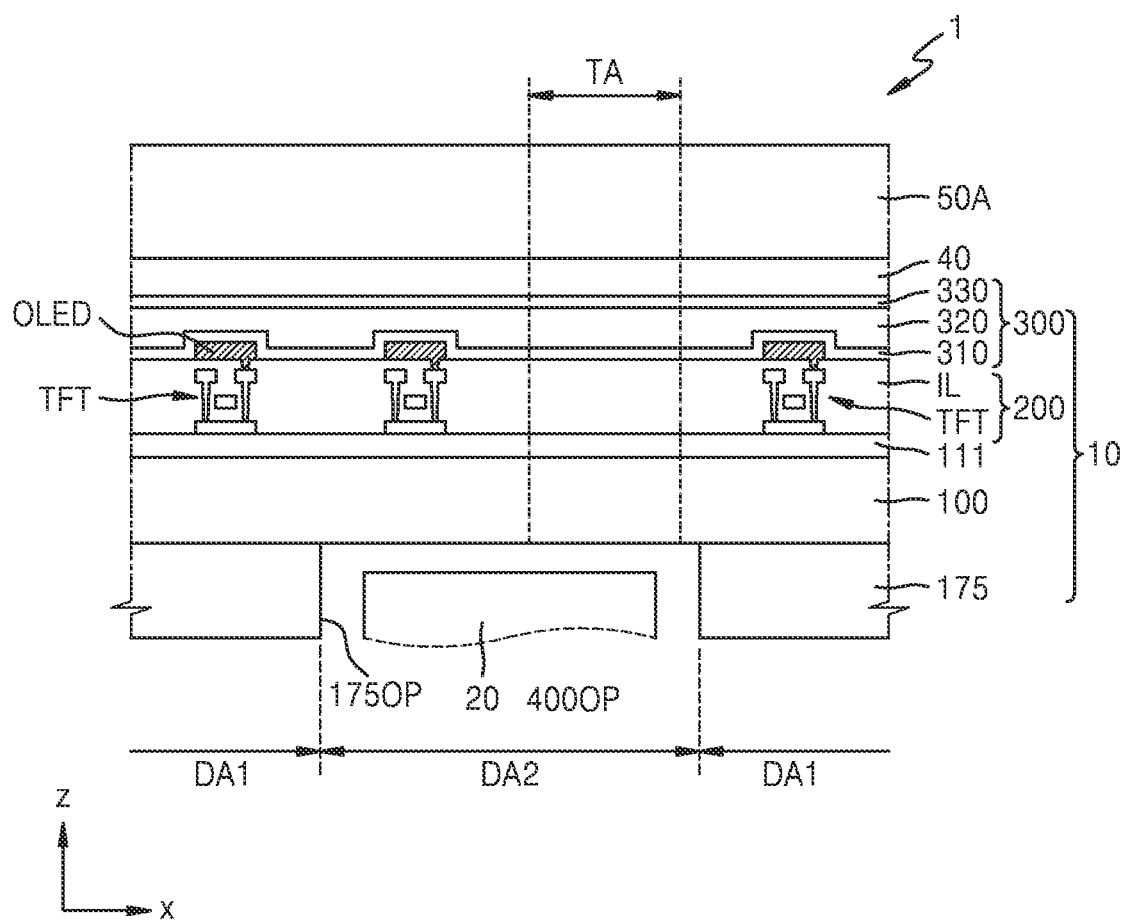
FIGS. 2A and 2B are cross-sectional views illustrating a portion of an electronic apparatus including a display device according to some example embodiments.
Figure 2B:
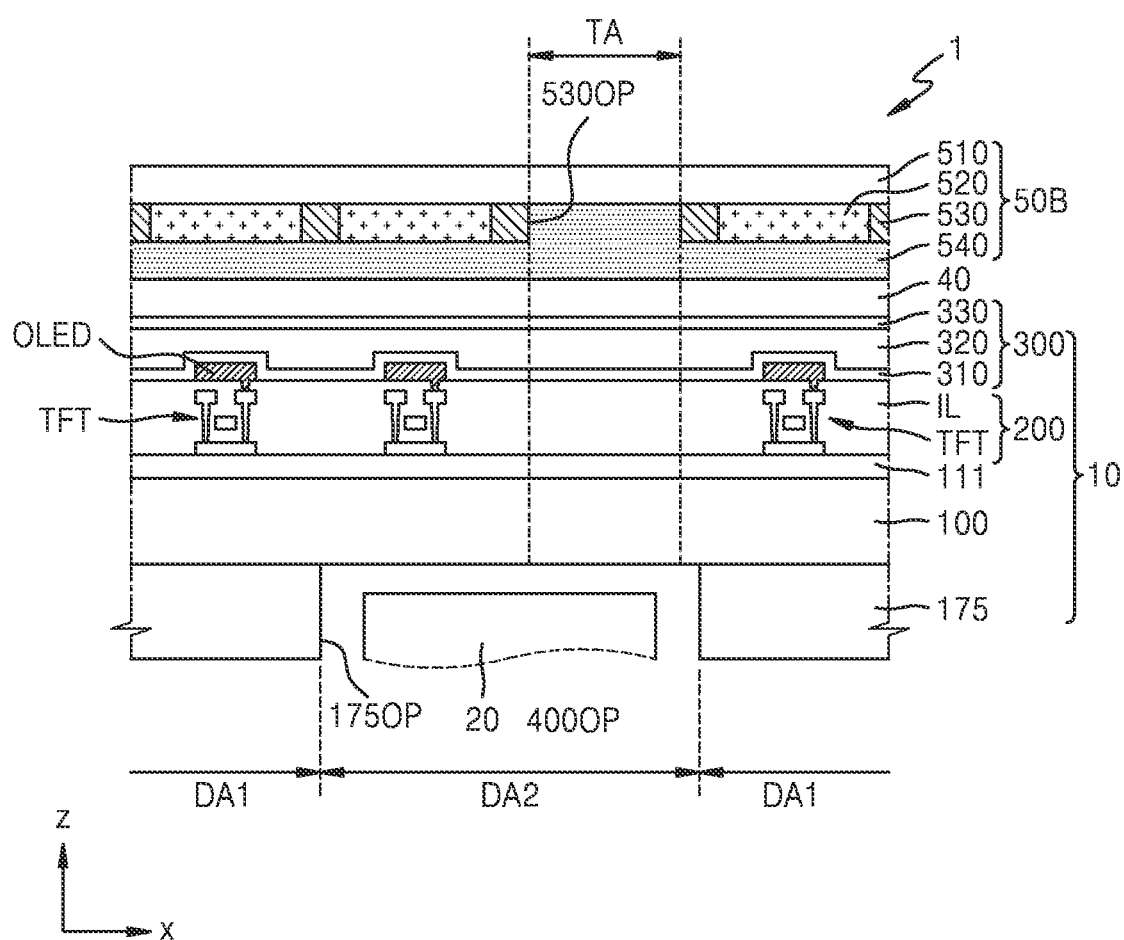

FIGS. 2A and 2B are cross-sectional views illustrating a portion of an electronic apparatus including a display device according to some example embodiments.

Referring to FIGS. 2A and 2B, an electronic apparatus 1 may include a display device 10 and a component 20 arranged to overlap the display device 10.

The display device 10 may include a substrate 100, a display layer 200 arranged on the substrate 100, a thin film encapsulation layer 300 on the display layer 200, a touch input layer 40, and an optical functional layer such as an optical plate 50A (FIG. 2A) or a filter plate 50B (FIG. 2B).

The substrate 100 may include glass or polymer resin. The polymer resin may include polyether sulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including an inorganic layer and a layer including the above polymer resin.

The display layer 200 may be arranged on the front surface of the substrate 100, and a lower protection film 175 may be arranged on the rear surface of the substrate 100. The lower protection film 175 may be attached to the rear surface of the substrate 100. An adhesive layer may be located between the lower protection film 175 and the substrate 100. Alternatively, the lower protection film 175 may be directly formed on the rear surface of the substrate 100, and in this case, an adhesive layer may not be located between the lower protection film 175 and the substrate 100.

The lower protection film 175 may function to support and protect the substrate 100. The lower protection film 175 may include an opening 175OP corresponding to the second display area DA2. Because the lower protection film 175 includes the opening 175OP, the light transmittance of the second display area DA2, for example, the light transmittance of the transmission area TA, may be improved. The lower protection film 175 may include polyethylene terephthalate (PET) or polyimide (PI).

The display layer 200 may include a circuit layer including a thin film transistor TFT, a display element layer including an organic light emitting diode OLED as a display element, and an insulating layer IL. A thin film transistor TFT and an organic light emitting diode OLED electrically connected to the thin film transistor TFT may be arranged in each of the first display area DA1 and the second display area DA2. The second display area DA2 may include a transmission area TA in which a thin film transistor TFT and an organic light emitting diode OLED are not arranged.

The transmission area TA may be an area through which the light emitted from the component 20 and/or directed to the component 20 may be transmitted. The transmittance of the transmission area TA may be about 50% or more, about 60% or more, about 75% or more, about 80% or more, about 85% or more, or about 90% or more.

The thin film encapsulation layer 300 may include at least one inorganic encapsulation layer and at least one organic encapsulation layer. According to some example embodiments, the thin film encapsulation layer 300 may include first and second inorganic encapsulation layers 310 and 330 and an organic encapsulation layer 320 therebetween.

The touch input layer 40 may be configured to obtain coordinate information according to an external input, for example, a touch event. The touch input layer 40 may include a touch electrode and trace lines connected to the touch electrode. The touch input layer 40 may be configured to sense an external input by a mutual cap method or a self cap method.

The touch input layer 40 may be formed on the thin film encapsulation layer 300. Alternatively, the touch input layer 40 may be separately formed and then coupled on the thin film encapsulation layer 300 through an adhesive layer such as an optical clear adhesive (OCA). According to some example embodiments, as illustrated in FIGS. 2A and 2B, the touch input layer 40 may be directly formed on the thin film encapsulation layer 300, and in this case, an adhesive layer may not be located between the touch input layer 40 and the thin film encapsulation layer 300.

The optical functional layer may include an anti-reflection layer. The anti-reflection layer may be configured to reduce the reflectance of light (external light) incident from the outside toward the display device 10.

According to some example embodiments, the anti-reflection layer may include an optical plate 50A including a phase retarder and/or polarizer as illustrated in FIG. 2A. The phase retarder may be a film type or a liquid crystal coating type and may include a λ/2 phase retarder and/or a λ/4 phase retarder. The polarizer may also be a film type or a liquid crystal coating type. The film-type polarizer may include a stretched synthetic resin film, and the liquid crystal coating-type polarizer may include liquid crystals arranged in a certain arrangement.

According to some example embodiments, the anti-reflection layer may include a filter plate 50B including a black matrix and color filters as illustrated in FIG. 2B. The filter plate 50B may include a base layer 510, color filters 520 on the base layer 510, a black matrix 530, and an overcoat layer 540.

The color filters 520 may be arranged considering the color of light emitted from each of the pixels of the display device 10. For example, the color filter 520 may have a red, green, or blue color depending on the color of light emitted from the organic light emitting diode (OLED). The color filter 520 and the black matrix 530 are not in the transmission area TA. For example, a layer including the color filter 520 and the black matrix 530 may include a hole 530OP corresponding to the transmission area TA, and the hole 530OP may be at least partially filled with a portion of the overcoat layer 540. The overcoat layer 540 may include an organic material such as resin, and the organic material may be transparent.

According to some example embodiments, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and accordingly, the external light reflectance may be reduced.

The component 20 may be located in the second display area DA2. The component 20 may include an electronic element using light or sound. For example, the electronic element may include a sensor (e.g., as a proximity sensor) for measuring a distance, a sensor for recognizing a portion of a user's body (e.g., a fingerprint, an iris, or a face), a small lamp for outputting light, or an image sensor (e.g., a camera) for capturing an image. The electronic element using light may use light of various wavelength bands such as visible light, infrared light, and ultraviolet light. The electronic element using sound may use ultrasound or sound of other frequency bands.

One component 20 may be arranged in the second display area DA2, or a plurality of components 20 may be arranged therein. According to some example embodiments, the component 20 may include a light emitter and a light receiver. The light emitter and the light receiver may be an integrated structure or may be a physically separated structure in which a pair of light emitter and light receiver may form one component 20.

Figure 3:
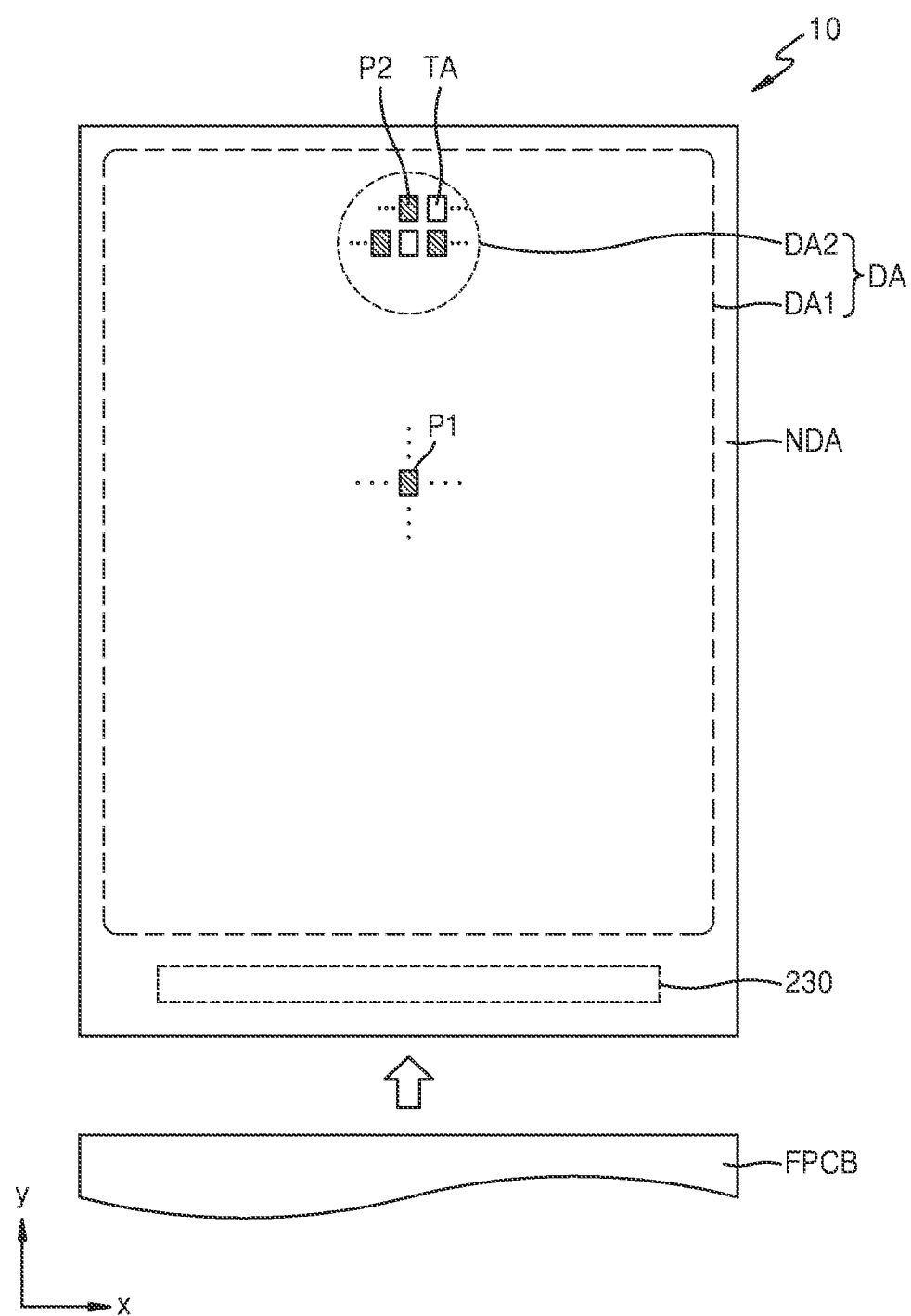
FIG. 3 is a plan view schematically illustrating a display device according to some example embodiments.

FIG. 3 is a plan view schematically illustrating a display device according to some example embodiments.

Referring to FIG. 3, a display device 10 may include an array of a plurality of pixels arranged on a substrate 100. The plurality of pixels may include first pixels P1 arranged in a first display area DA1 and second pixels P2 arranged in a second display area DA2, and an image may be provided by using the light emitted from a display element included in each of the plurality of pixels.

A display area DA may include the first display area DA1 and the second display area DA2, wherein the area of the first display area DA1 and the area of the second display area DA2 may be different from each other. The area of the first display area DA1 may be larger than the area of the second display area DA2, and the second display area DA2 may be entirely surrounded by the first display area DA1.

The first pixels P1 may be two-dimensionally arranged in the first display area DA1, and the second pixels P2 may be two-dimensionally arranged in the second display area DA2. A transmission area TA may be arranged in the second display area DA2. The transmission area TA may be arranged between adjacent second pixels P2.

A non-display area NDA may entirely surround the display area DA. A scan driver, a data driver, or the like may be arranged in the non-display area NDA. A pad 230 may be located in the non-display area NDA. The pad 230 may be arranged adjacent to one side edge of the substrate 100. The pad 230 may be exposed by not being covered by an insulating layer and may be electrically connected to a flexible printed circuit board FPCB. The flexible printed circuit board FPCB may electrically connect a controller to the pad 230 and may supply a signal or power transmitted from the controller. In some embodiments, a data driver may be arranged in the flexible printed circuit board FPCB. In order to transmit signals or voltages from the flexible printed circuit board FPCB to the first and second pixels P1 and P2, the pad 230 may be connected to a plurality of lines.

According to some example embodiments, instead of the flexible printed circuit board FPCB, an integrated circuit IC may be arranged on the pad 230. The integrated circuit IC may include, for example, a data driver and may be electrically connected to the pad 230 through an anisotropic conductive film including conductive balls.

Figure 4:
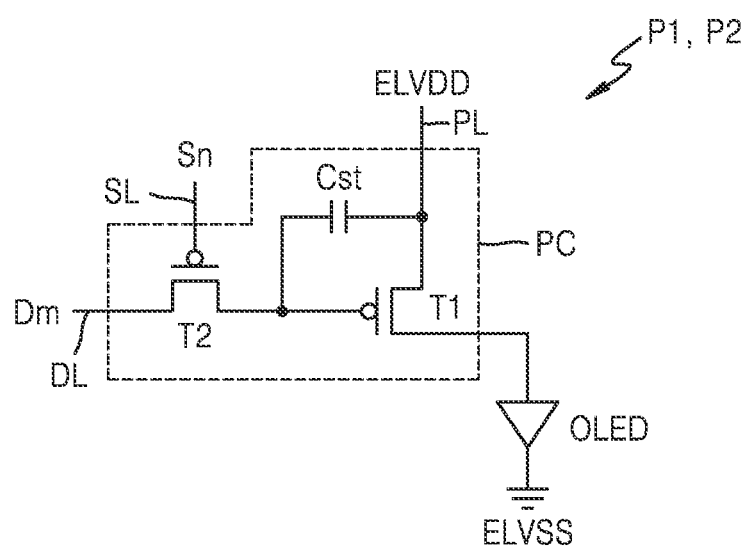
FIG. 4 is an equivalent circuit diagram schematically illustrating any one pixel of a display device according to some example embodiments.

FIG. 4 is an equivalent circuit diagram schematically illustrating any one pixel of a display device according to some example embodiments.

Each of a first pixel P1 and a second pixel P2 may include an organic light emitting diode OLED as a display element. The organic light emitting diode OLED may be electrically connected to or driven by a pixel circuit PC. The pixel circuit PC may include a first thin film transistor T1, a second thin film transistor T2, and a storage capacitor Cst. Each organic light emitting diode OLED may emit, for example, red, green, or blue light.

As a switching thin film transistor, the second thin film transistor T2 may be connected to a scan line SL and a data line DL and may be configured to transmit a data voltage (or a data signal) Dm input from the data line DL to the first thin film transistor T1, based on a switching voltage (or a switching signal) Sn input from the scan line SL. The storage capacitor Cst may be connected to the second thin film transistor T2 and a driving voltage line PL and may be configured to store a voltage corresponding to the difference between a voltage received from the second thin film transistor T2 and a first power voltage ELVDD supplied to the driving voltage line PL.

As a driving thin film transistor, the first thin film transistor T1 may be connected to the driving voltage line PL and the storage capacitor Cst and may be configured to control a driving current flowing from the driving voltage line PL through the organic light emitting diode OLED in response to a voltage value stored in the storage capacitor Cst. The organic light emitting diode OLED may emit light with a certain brightness according to the driving current. An opposite electrode (e.g., a cathode) of the organic light emitting diode OLED may be supplied with a second power voltage ELVSS.

Although FIG. 4 illustrates that the pixel circuit PC includes two thin film transistors and one storage capacitor, embodiments according to the present disclosure are not limited thereto. The number of thin film transistors and the number of storage capacitors may be variously modified according to the design of the pixel circuit PC. For example, the pixel circuit PC may further include four or five or more thin film transistors in addition to the two thin film transistors described above. In other words, according to some example embodiments, the components of the pixel circuit PC may be modified to include additional electronic circuit components, or fewer electronic circuit components, without departing from the spirit and scope of embodiments according to the present disclosure.

Figure 5A:
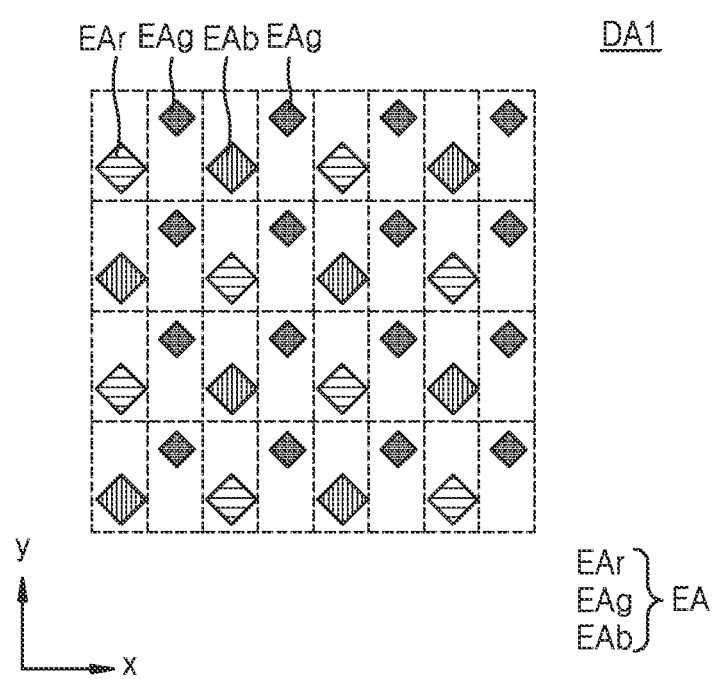
FIG. 5A is a plan view illustrating an emission area of a first display area in a display device according to some example embodiments.
Figure 5B:
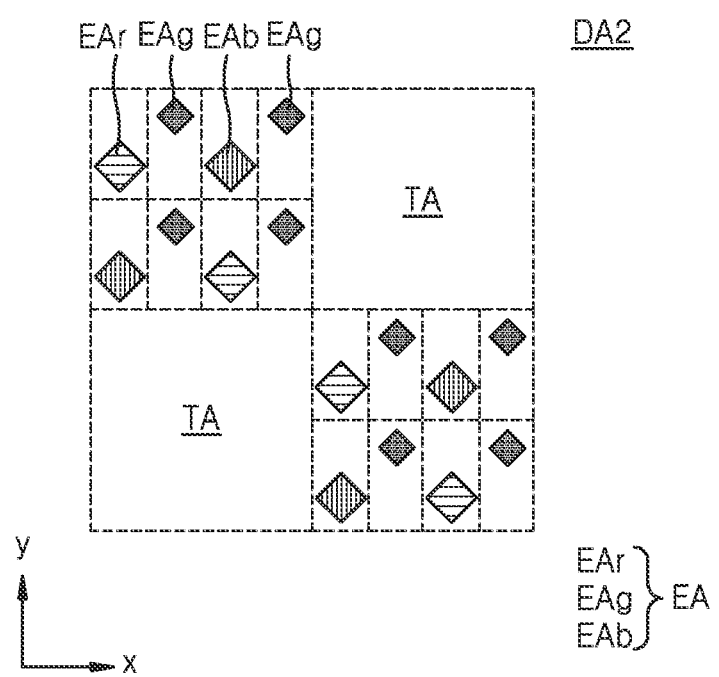
FIGS. 5B and 5C are plan views illustrating an emission area and a transmission area of a second display area in a display device according to some example embodiments.
Figure 5C:
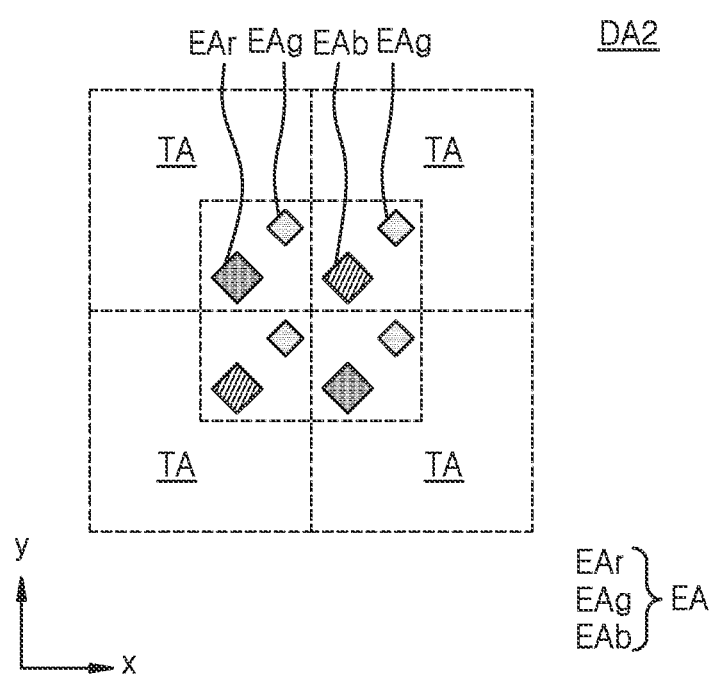

FIG. 5A is a plan view illustrating an emission area of a first display area in a display device according to some example embodiments, and FIGS. 5B and 5C are plan views illustrating an emission area and a transmission area of a second display area in a display device according to some example embodiments.

Referring to FIG. 5A, areas where light is emitted from a display element provided in each of first pixels (hereinafter referred to as emission areas EA) may be arranged in a first display area DA1. According to some example embodiments, FIG. 5A illustrates that a red emission area EAr, a green emission area EAg, and a blue emission area EAb are arranged in a pentile type. According to some example embodiments, a red emission area EAr, a green emission area EAg, and a blue emission area EAb may be arranged in a stripe type.

Referring to FIGS. 5B and 5C, emission areas EA where light is emitted from a display element provided in each of second pixels may be arranged in a second display area DA2. A red emission area EAr, a green emission area EAg, and a blue emission area EAb may be arranged in a pentile type as illustrated in FIG. 5B or may be arranged in various types such as a stripe type.

A transmission area TA may be arranged adjacent to the emission areas EA. The transmission area TA may be arranged adjacent to a group including red emission areas EAr, green emission areas EAg, and blue emission areas EAb. The transmission areas TA may be alternately arranged as illustrated in FIG. 5B or may be arranged adjacent to each other as illustrated in FIG. 5C.

The arrangement structure of the emission areas EA illustrated in FIG. 5B may have a relatively smaller area of the transmission area TA and a greater number of emission areas EA than the arrangement structure of the emission areas EA illustrated in FIG. 5C. According to some example embodiments, the arrangement of emission areas EA in the second display area DA2 may be the same as that illustrated in FIG. 5B or may be the same as that illustrated in FIG. 5C. Alternatively, the arrangement of emission areas EA in the second display area DA2 may include both the arrangement illustrated in FIG. 5B and the arrangement illustrated in FIG. 5C.

Figure 6:
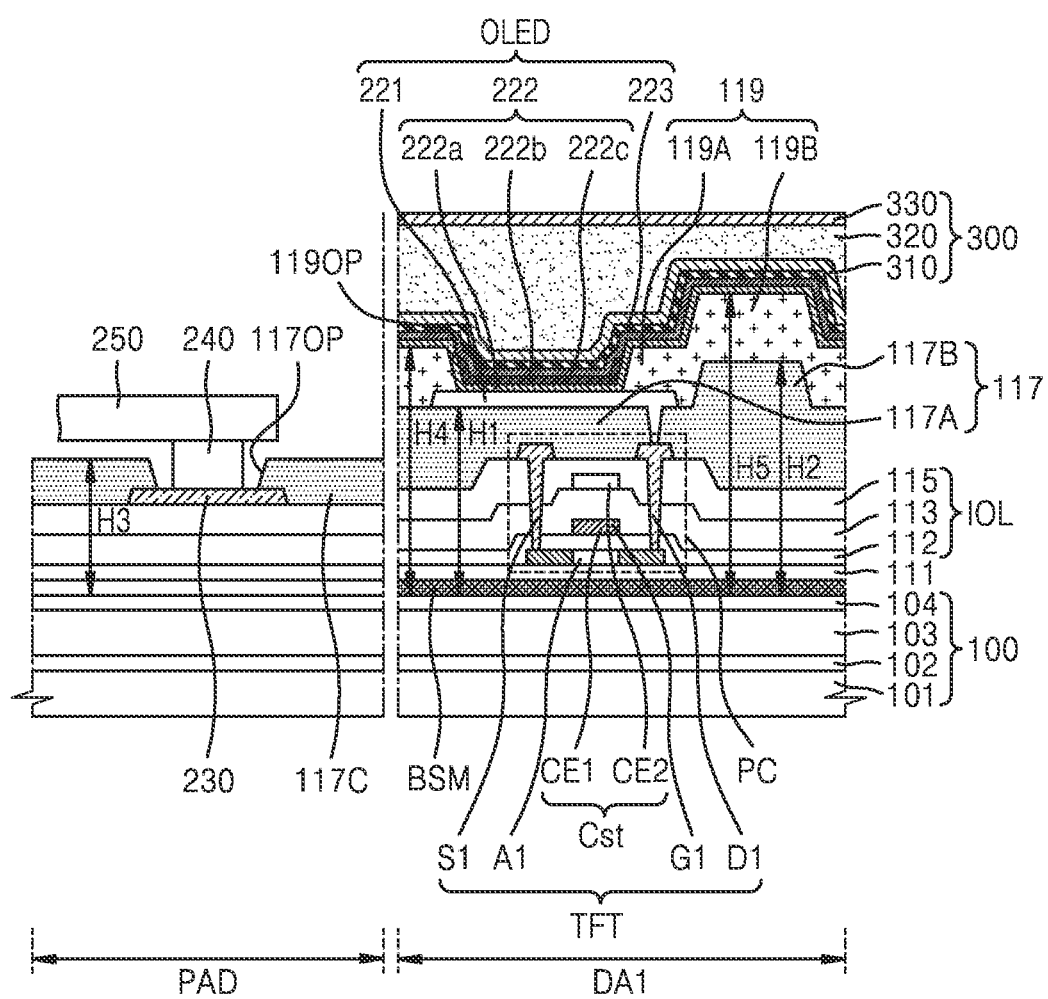
FIG. 6 is a cross-sectional view illustrating a portion of a display device according to some example embodiments.

FIG. 6 is a cross-sectional view illustrating a portion of a display device according to some example embodiments. FIG. 6 illustrates a first display area DA1 and a pad area PAD.

First, the first display area DA1 of FIG. 6 will be described.

A substrate 100 may include polymer resin. For example, the substrate 100 may include a base layer including polymer resin and a barrier layer of an inorganic insulating layer. For example, the substrate 100 may include a first base layer 101, a first barrier layer 102, a second base layer 103, and a second barrier layer 104 that are sequentially stacked. The first base layer 101 and the second base layer 103 may include polyether sulfone, polyacrylate, polyether imide, polyethylene naphthalate, polyethylene terephthalate, polyphenylene sulfide, polyarylate, polyimide, polycarbonate, or cellulose acetate propionate. The first barrier layer 102 and the second barrier layer 104 may include an inorganic insulating material such as silicon oxide, silicon oxynitride, and/or silicon nitride.

A back-side metal layer BMS may be arranged on the substrate 100. The back-side metal layer BSM may be electrically connected to a line, a storage capacitor, or a transistor connected to a pixel circuit. For example, the back-side metal layer BSM may be electrically connected to a gate electrode, a source electrode, or a drain electrode of a thin film transistor TFT or may be electrically connected to any one capacitor plate of the storage capacitor or the driving voltage line PL (see FIG. 4) described above with reference to FIG. 4.

The back-side metal layer BSM may entirely cover the first display area DA1. Alternatively, the back-side metal layer BSM may cover a portion of the first display area DA1. For example, the back-side metal layer BSM may be patterned to directly overlap the thin film transistor TFT in the first display area DA1. In some embodiments, the back-side metal layer BSM may be omitted.

A buffer layer 111 may be arranged on the substrate 100, for example, on a back-side metal layer BSM. The buffer layer 111 may reduce or block the penetration of foreign materials, moisture, or external air from the bottom of the substrate 100 and may provide a flat surface on the substrate 100. The buffer layer 111 may include an inorganic insulating material such as silicon oxide, silicon oxynitride, or silicon nitride and may be formed in a single-layer or multilayer structure including the above material.

A pixel circuit PC including a thin film transistor TFT and a storage capacitor Cst may be arranged on the buffer layer 111. The thin film transistor TFT may include a semiconductor layer A1, a gate electrode G1 overlapping a channel area of the semiconductor layer A1, and a source electrode S1 and a drain electrode D1 respectively connected to a source area and a drain area of the semiconductor layer A1. A gate insulating layer 112 may be located between the semiconductor layer A1 and the gate electrode G1, and a first interlayer insulating layer 113 and a second interlayer insulating layer 115 may be arranged between the gate electrode G1 and the source electrode S1 or between the gate electrode G1 and the drain electrode D1.

The storage capacitor Cst may be arranged to overlap the thin film transistor TFT. The storage capacitor Cst may include a first capacitor plate CE1 and a second capacitor plate CE2 that overlap each other. According to some example embodiments, the gate electrode G1 of the thin film transistor TFT may include the first capacitor plate CE1 of the storage capacitor Cst. The first interlayer insulating layer 113 may be arranged between the first capacitor plate CE1 and the second capacitor plate CE2.

The semiconductor layer A1 may include polysilicon. According to some example embodiments, the semiconductor layer A1 may include amorphous silicon. In some embodiments, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The semiconductor layer A1 may include a channel area and a source area and a drain area that are doped with dopants.

The gate insulating layer 112 may include an inorganic insulating material such as silicon oxide, silicon oxynitride, or silicon nitride and may have a single-layer or multilayer structure including the above material.

The gate electrode G1 or the first capacitor plate CE1 may include a low-resistance conductive material such as molybdenum (Mo), aluminum (Al), copper (Cu), and/or titanium (Ti) and may have a single-layer or multilayer structure including the above material.

The first interlayer insulating layer 113 may include an inorganic insulating material such as silicon oxide, silicon oxynitride, or silicon nitride and may have a single-layer or multilayer structure including the above material.

The second capacitor plate CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multilayer structure including the above material.

The second interlayer insulating layer 115 may include an inorganic insulating material such as silicon oxide, silicon oxynitride, or silicon nitride and may have a single-layer or multilayer structure including the above material.

The source electrode S1 or the drain electrode D1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multilayer structure including the above material. For example, the source electrode S1 or the drain electrode D1 may have a three-layer structure of titanium layer/aluminum layer/titanium layer.

A first insulating layer 117 may include a different material than at least one inorganic insulating layer IOL arranged thereunder, for example, the gate insulating layer 112, the first interlayer insulating layer 113, or the second interlayer insulating layer 115. The first insulating layer 117 may include an organic insulating material. The first insulating layer 117 may include an organic insulating material such as acryl, benzocyclobutene (BCB), polyimide, or hexamethyldisiloxane (HMDSO). The organic insulating material of the first insulating layer 117 may include a photosensitive organic insulating material.

The first insulating layer 117 may be formed through an exposure and development process using a mask having a different transmittance in each area, such as a halftone mask, after forming a photosensitive organic insulating material on the substrate 100. The first insulating layer 117 formed by the above method may have different heights in the respective portions. Herein, the height may refer to the height from the top surface of the substrate 100.

The first insulating layer 117 may include a first portion 117A overlapping a pixel electrode 221 described below, and a second portion 117B adjacent to the pixel electrode 221 without overlapping the pixel electrode 221. A first height H1 of the first portion 117A of the first insulating layer 117 from the substrate 100 may be smaller than a second height H2 of the second portion 117B of the first insulating layer 117 therefrom. For example, a first height H1 from the top surface of the substrate 100 to the top surface of the first portion 117A of the first insulating layer 117 may be smaller than a second height H2 from the top surface of the substrate 100 to the top surface of the second portion 117B of the first insulating layer 117.

The pixel electrode 221 may contact the top surface of the first portion 117A of the first insulating layer 117. The pixel electrode 221 may be electrically connected to the thin film transistor TFT through a contact hole formed in the first insulating layer 117.

The pixel electrode 221 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. The pixel electrode 221 may include a reflection layer including the above material, and a transparent conductive layer arranged over and/or under the reflection layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may have a three-layer structure of ITO layer/Ag layer/ITO layer sequentially stacked.

A second insulating layer 119 may be arranged on the pixel electrode 221. The second insulating layer 119 may cover the edge of the pixel electrode 221 and may include an opening 119OP overlapping the center portion of the pixel electrode 221.

The second insulating layer 119 may include a colored material. For example, the second insulating layer 119 may include a colored pigment, for example, a pigment of white color, black color, or other color. According to some example embodiments, the second insulating layer 119 may have a black color. For example, a pixel definition layer 180 may include a polyimide (PI)-based binder and a pigment in which red, green, and blue colors are mixed. Alternatively, the second insulating layer 119 may include a cardo-based binder resin and a mixture of lactam-based black pigment and blue pigment. Alternatively, the second insulating layer 119 may include a carbon black.

Because the second insulating layer 119 includes a colored material, it may prevent or reduce the reflection of external light. The second insulating layer 119 including a colored pigment may prevent or reduce the reflection of external light traveling from the outside toward the display device and may improve the contrast of the display device.

The shape of the top surface of the second insulating layer 119 may depend on the different height of each portion of the first insulating layer 117 formed thereunder. A fourth height H4 of a first portion 119A of the second insulating layer 119 may be smaller than a fifth height H5 of a second portion 119B of the second insulating layer 119. For example, a fourth height H4 from the top surface of the substrate 100 to the top surface of the first portion 119A of the second insulating layer 119 may be smaller than a fifth height H2 from the top surface of the substrate 100 to the top surface of the second portion 119B of the second insulating layer 119. The first portion 119A of the second insulating layer 119 may overlap the first portion 117A of the first insulating layer 117, and the second portion 119B of the second insulating layer 119 may overlap the second portion 117B of the first insulating layer 117.

The second portion 119B of the second insulating layer 119 may prevent or reduce damage to layers arranged under a mask used in the process of forming an emission layer 222b of an intermediate layer 222 described below, for example, the pixel electrode 221 and/or the first portion 119A of the second insulating layer 119. The fifth height H5 may be greater than the fourth height H4 by about 0.5 μm or more, for example, about 1 μm or more.

The intermediate layer 222 may include an emission layer 222b overlapping the pixel electrode 221. The emission layer 222b may include an organic material. The emission layer 222b may include a high-molecular or low-molecular weight organic material for emitting light of a certain color. The emission layer 222b may be formed through a deposition process using a mask as described above.

A first functional layer 222a and a second functional layer 222c may be arranged under and/or over the emission layer 222b.

The first functional layer 222a may include a single layer or a multiple layer. For example, when the first functional layer 222a is formed of a high-molecular weight material, the first functional layer 222a may include a hole transport layer (HTL) having a single-layer structure and may be formed of poly-(3,4)-ethylene-dioxy thiophene (PEDOT) or polyaniline (PANI). When the first functional layer 222a is formed of a low-molecular weight material, the first functional layer 222a may include a hole injection layer (HIL) and an HTL.

The second functional layer 222c may be optional. For example, when the first functional layer 222a and the emission layer 222b are formed of a high-molecular weight material, the second functional layer 222c may be formed. The second functional layer 222c may include a single layer or a multiple layer. The second functional layer 222c may include an electron transport layer (ETL) and/or an electron injection layer (EIL).

Each of the first functional layer 222a and the second functional layer 222c may be integrally formed to entirely cover a display area, for example, the first display area DA1 and a second display area DA2 described below with reference to FIG. 7.

An opposite electrode 223 may include a conductive material having a relatively low work function. For example, the opposite electrode 223 may include a (semi) transparent layer including silver (Ag), magnesium (Mg), aluminum (Al), nickel (Ni), chromium (Cr), lithium (Li), calcium (Ca), or any alloy thereof. Alternatively, the opposite electrode 223 may further include a layer such as ITO, IZO, ZnO, or $In_2O_3$ on the (semi) transparent layer including the above material. According to some example embodiments, the opposite electrode 223 may include silver (Ag) and magnesium (Mg).

The stack structure of the pixel electrode 221, the intermediate layer 222, and the opposite electrode 223 sequentially stacked may form a light emitting diode, for example, an organic light emitting diode OLED. The organic light emitting diode OLED may be covered by a thin film encapsulation layer 300.

The thin film encapsulation layer 300 may include first and second inorganic encapsulation layers 310 and 330 and an organic encapsulation layer 320 therebetween.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through chemical vapor deposition.

The organic encapsulation layer 320 may include a polymer-based material. The polymer-based material may include acrylic resin, epoxy resin, polyimide, polyethylene, or the like. For example, the organic encapsulation layer 320 may include acrylic resin such as polymethyl methacrylate or polyacrylic acid. The organic encapsulation layer 320 may be formed by curing a monomer or applying a polymer.

Next, the pad area PAD of FIG. 6 will be described in more detail.

A pad 230 may be formed on at least one inorganic insulating layer IOL, for example, on the second interlayer insulating layer 115. The pad 230 may be formed of the same material as the source electrode S1 or the drain electrode D1 of the thin film transistor TFT.

The first insulating layer 117 may include a third portion 117C extending into the pad area PAD. The third portion 117C may include an opening 117OP overlapping the pad 230. The third portion 117C of the first insulating layer 117 may cover the edge of the pad 230. The third portion 117C of the first insulating layer 117 may have a smaller height than the first portion 117A and the second portion 117B for connection between an electronic structure 250 and the pad 230. For example, a third height H3 from the top surface of the substrate 100 to the top surface of the third portion 117C of the first insulating layer 117 may be smaller than the first height H1 and the second height H2 described above.

The pad 230 may be electrically connected to the electronic structure 250 through the opening 117OP of the third portion 117C. A conductive material layer 240 may be located between the pad 230 and the electronic structure 250 to electrically connect the pad 230 to the electronic structure 250.

The electronic structure 250 may include a data driver, lines for providing a first power voltage and/or a second power voltage, and a circuit structure capable of providing various control signals to pixels. The electronic structure 250 may include the flexible printed circuit board FPCB described with reference to FIG. 3 or may include a chip-type integrated circuit (IC).

The conductive material layer 240 may be a bump included in the electronic structure 250. For example, the electronic structure 250 may be electrically connected to the pad 230 by the bump provided at the bottom thereof to directly contact the pad 230. Alternatively, the conductive material layer 240 may be a conductive adhesive layer such as an anisotropic conductive film. In this case, the bump of the electronic structure 250 may contact a conductive ball included in the conductive material layer 240 that is an anisotropic conductive film, and the conductive ball may contact the pad 230 such that the electronic structure 250 may be electrically connected to the pad 230.

Figure 7:
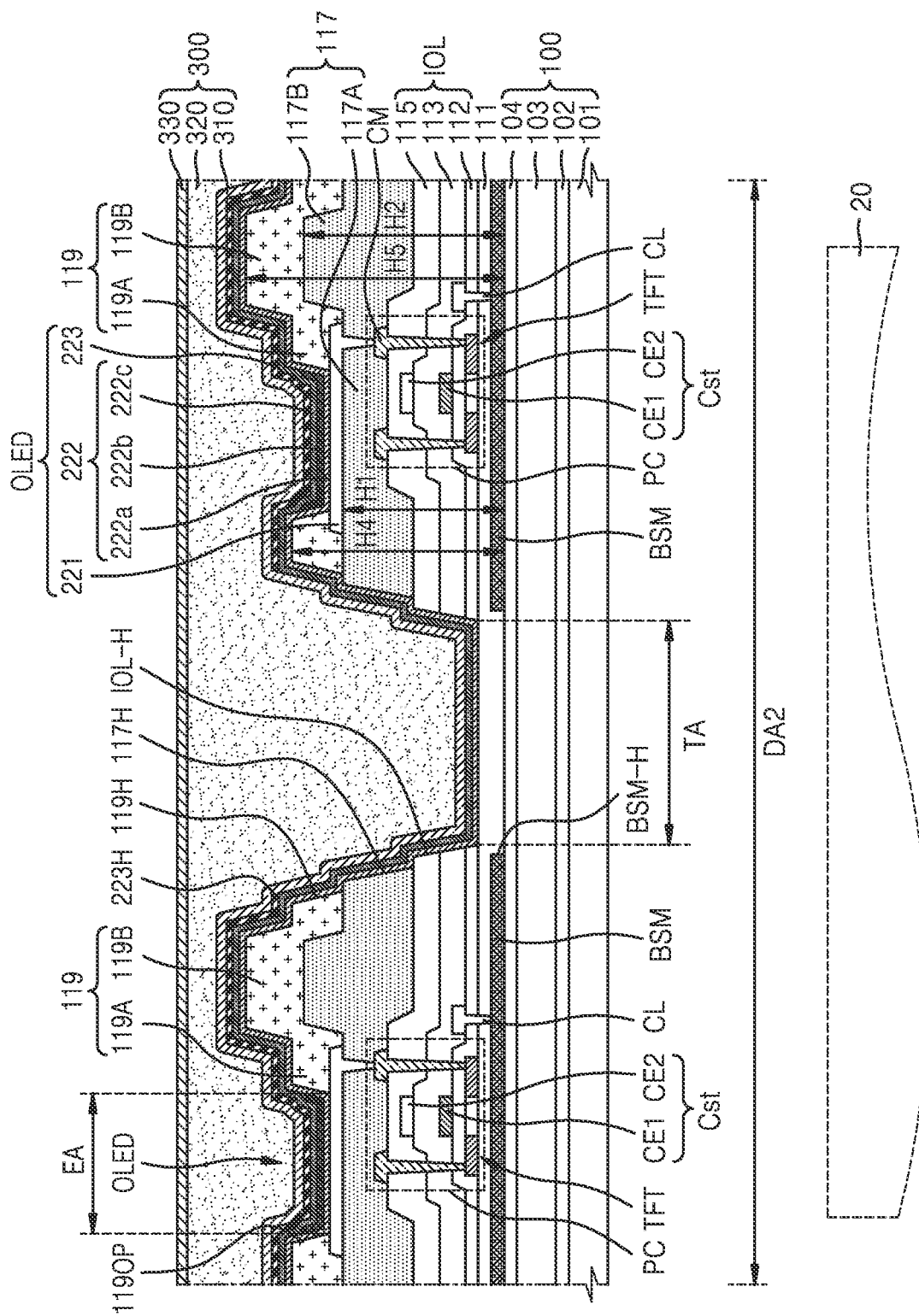
FIG. 7 is a cross-sectional view illustrating a portion of a display device according to some example embodiments.
Figure 8:
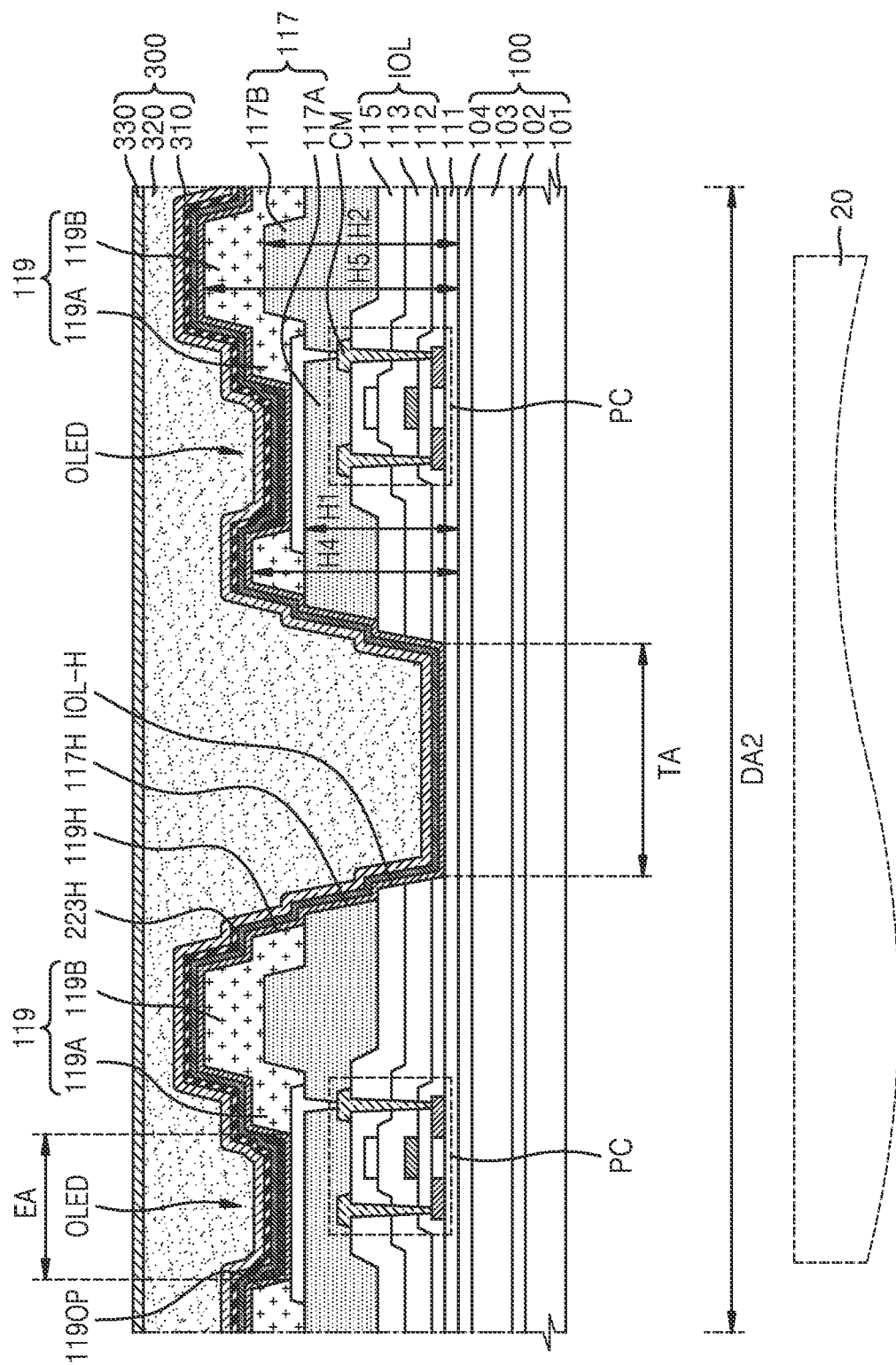
FIG. 8 is a cross-sectional view illustrating a portion of a display device according to some example embodiments.

FIGS. 7 and 8 are cross-sectional views illustrating a portion of a display device according to some example embodiments. FIGS. 7 and 8 illustrate a second display area DA2.

Referring to FIG. 7, the second display area DA2 may include a transmission area TA, and two pixel circuits PC and two organic light emitting diodes OLED may be arranged adjacent to each other with the transmission area TA therebetween. Each organic light emitting diode OLED may be electrically connected to each pixel circuit PC. The organic light emitting diode OLED described with reference to FIG. 6 may be a display element included in the first pixel arranged in the first display area DA1 (see FIG. 6), and the organic light emitting diode OLED illustrated in FIG. 7 may correspond to a display element included in the second pixel arranged in the display area DA2.

The structure of the organic light emitting diode OLED and the structure of the pixel circuit PC including a thin film transistor TFT and a storage capacitor Cst illustrated in FIG. 7 may be substantially the same as the structures described above with reference to FIG. 6. That is, the cross-sectional structure of the organic light emitting diode OLED and the thin film transistor TFT corresponding to the first pixel of the first display area DA1 may be the same as the cross-sectional structure of the organic light emitting diode OLED and thin film transistor TFT corresponding to the second pixel of the second display area DA2. Thus, the descriptions of the particular structure of the organic light emitting diode OLED and the structure of the thin film transistor TFT and the storage capacitor Cst will be replaced with the above descriptions, and hereinafter, the differences thereof will be mainly described and some repetitive description of certain components may be omitted.

Insulating layers on a substrate 100, for example, at least one inorganic insulating layer IOL, a first insulating layer 117, or a second insulating layer 119, may include holes corresponding to the transmission area TA. The at least one inorganic insulating layer IOL may include at least one of a gate insulating layer 112, a first interlayer insulating layer 113, or a second interlayer insulating layer 115.

A first hole IOL-H of the at least one inorganic insulating layer IOL, a second hole 117H of the first insulating layer 117, or a third hole 119H of the second insulating layer 119 may overlap with other in the transmission area TA. According to some example embodiments, the buffer layer 111 may have a hole in the transmission area TA. An opposite electrode 223 may also include a fourth hole 223H located in the transmission area TA, and the fourth hole 223H may overlap the first hole IOL-H, the second hole 117H, and the third hole 119H.

Some of the insulating layers, for example, a buffer layer 111 and a second barrier layer 104, may not include a hole located in the transmission area TA. For example, as illustrated in FIG. 7, the buffer layer 111 and the second barrier layer 104 may cover the transmission area TA. According to some example embodiments, the buffer layer 111 and/or the second barrier layer 104 may include a hole located in the transmission area TA.

A first portion 117A of the first insulating layer 117 may overlap an opening 119OP of the second insulating layer 119. Because the opening 119OP of the second insulating layer 119 may define an emission area EA, the first portion 117A of the first insulating layer 117 may overlap the emission area EA. The fact that two adjacent organic light emitting diodes OLED are spaced apart from each other with the transmission area TA therebetween may correspond to the fact that two adjacent emission areas EA are spaced apart from each other with the transmission area TA therebetween. Similarly, second portions 117B of two adjacent first insulating layers 117 may be spaced apart from each other with the transmission area TA therebetween.

Portions of an intermediate layer 222 of the organic light emitting diode OLED, for example, a first functional layer 222a and/or a second functional layer 222c, may be integrally formed to cover the transmission area TA. Alternatively, like the opposite electrode 223, the first functional layer 222a and/or the second functional layer 222c may include a hole corresponding to the transmission area TA.

Because a thin film encapsulation layer 300 entirely covers a display area, it may continuously cover the first display area DA1 (see FIG. 6) and the second display area DA2. A first inorganic encapsulation layer 310, an organic encapsulation layer 320, and a second inorganic encapsulation layer 330 may cover the transmission area TA.

The light traveling in the direction from the thin film encapsulation layer 300 toward the substrate 100 (e.g., the light emitted from the organic light emitting diode and other external light) may travel to a component 20 through the transmission area TA, and the light traveling toward the substrate 100 may be diffracted by a narrow gap between the lines arranged in the second display area DA2. The above lines may be formed on the same layer as the gate electrode G1, the source electrode S1, or the drain electrode D1 of the thin film transistor TFT or the first capacitor plate CE1 or the second capacitor plate CE2 of the storage capacitor Cst.

When the light traveling toward the substrate 100 is diffracted, because the diffracted light may also reach the component 20, the signal or image received by the component 20 may be distorted. However, when the second insulating layer 119 includes a colored material as in some example embodiments, because the external light may be absorbed by the second insulating layer 119, the above-described diffraction problem may be prevented or reduced.

When a back-side metal layer BSM is arranged under the second insulating layer 119, the back-side metal layer BSM may effectively prevent or reduce the diffraction of light together with the second insulating layer 119 described above. According to some example embodiments, even when there is light that is not yet absorbed by the second insulating layer 119, the light may be blocked by the back-side metal layer BSM. In this case, in order to secure the transmittance of the transmission area TA, the back-side metal layer BSM may include a hole BSM-H corresponding to the transmission area TA.

The back-side metal layer BSM may be electrically connected to a conductive line CL. The conductive line CL may be electrically connected to the gate electrode, the source electrode, or the drain electrode of the thin film transistor TFT or may be electrically connected to any one capacitor plate of the storage capacitor Cst. Alternatively, the conductive line CL may be electrically connected to the driving voltage line PL (see FIG. 4) passing through the display area, for example, the second display area DA2. By the conductive line CL, the back-side metal layer BSM may be electrically connected to the gate electrode, the source electrode, or the drain electrode of the thin film transistor TFT, may be electrically connected to any one capacitor plate of the storage capacitor, or may be electrically connected to the driving voltage line.

The back-side metal layer BSM connected to the conductive line CL may protect the thin film transistor TFT from the external static electricity or improve the performance of the thin film transistor TFT.

Referring to FIGS. 6 and 7, the back-side metal layer BSM may be integrally formed and may include an area corresponding to a portion of the first display area DA1 and the second display area DA2 except the transmission area TA. According to some example embodiments, the back-side metal layer BSM may not be in the first display area DA1. According to some example embodiments, the back-side metal layer BSM may be locally located to overlap the thin film transistor TFT arranged in each of the first display area DA1 and the second display area DA2. In some embodiments, the back-side metal layer BSM may not be in the second display area DA2 as illustrated in FIG. 8.

FIGS. 7 and 8 illustrate that the thin film encapsulation layer 300 covers the organic light emitting diode OLED; however, according to some example embodiments, the organic light emitting diode OLED may be covered with an encapsulation substrate such as a glass.

Figure 9:
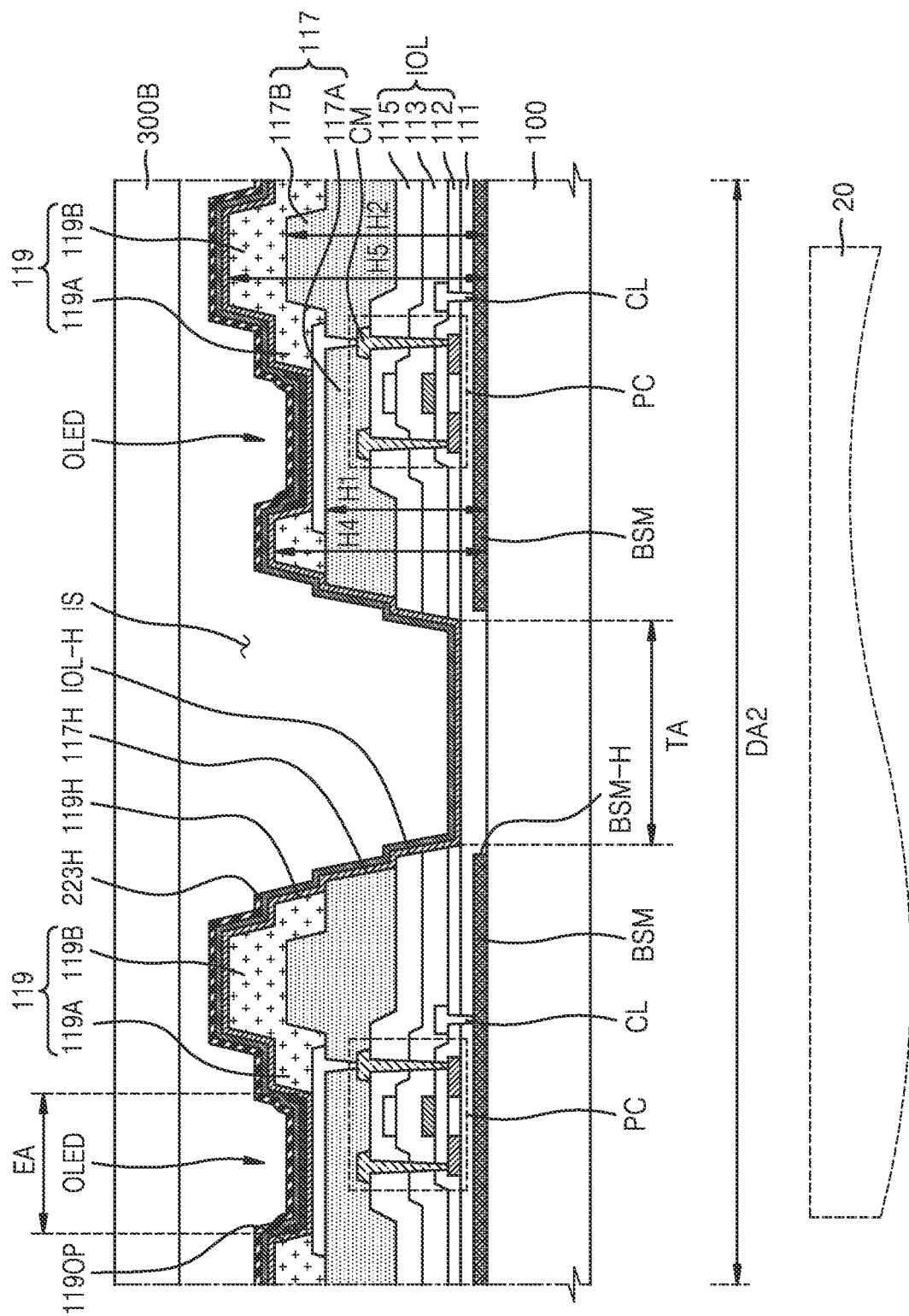
FIG. 9 is a cross-sectional view illustrating a portion of a display device according to some example embodiments.

FIG. 9 is a cross-sectional view illustrating a portion of a display device according to some example embodiments. FIG. 9 illustrates an embodiment which has substantially the same structure as the embodiment described with reference to FIG. 7 or 8 and in which an encapsulation substrate 300B is arranged instead of the thin film encapsulation layer 300 of FIG. 7 or 8.

A substrate 100 may include a glass material, and an encapsulation substrate 300B may also include a glass material. The substrate 100 and the encapsulation substrate 300B may each include a glass substrate. An internal space IS may be defined between the substrate 100 and the encapsulation substrate 300B, and an air layer may be in the internal space IS. Alternatively, a fluid layer may be in the internal space IS. The fluid layer may include a transparent material having a refractive index similar to that of the substrate 100 and the encapsulation substrate 300B. The transparent material may include a liquid transparent material. The transparent material may include epoxy, urethane acrylate, or epoxy acrylate or silicone (e.g., bisphenol A type epoxy, cycloaliphatic epoxy resin, phenyl silicone resin or rubber, acrylic epoxy resin, or aliphatic urethane acrylate)-based resin. Alternatively, silicone or silicone oil having no phase change in the temperature range of about −40° C. to about 100° C. and having a volume change rate within about 5%, for example, at least one material selected from hexamethyldisiloxane, octamethyltrisiloxane, decamethyltetrasiloxane, dodecamethylpentasiloxane, or polydimethylsiloxanes, may be used.

Aspects of some example embodiments according to the present disclosure may include a display device and an electronic apparatus including the same, which may prevent or reduce instances of degradation of a display element with respect to external light, may reduce the noise included in information to be obtained from a component such as a camera by reducing the external light propagating to the component, and/or may simplify a process thereof. However, these effects are merely examples and the scope of embodiments according to the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:
1. A display device comprising:
 a substrate corresponding to a first display area and a second display area;
 a plurality of first pixels in the first display area;
 a plurality of second pixels in the second display area, wherein a pixel density of the second display area is lower than a pixel density of the first display area;
 a plurality of pixel circuits electrically connected to the plurality of first pixels and the plurality of second pixels, the plurality of pixel circuits comprising two pixel circuits located in the second display area and spaced from each other with a transmission area therebetween, each of the two pixel circuits being electrically connected to two pixel electrodes;
 a first insulating layer between the two pixel circuits and the two pixel electrodes; and
 a second insulating layer on the first insulating layer, the second insulating layer comprising a first portion covering an edge of each of the two pixel electrodes and a second portion adjacent to the first portion,
 wherein the first insulating layer comprises:
  a third portion under the first portion of the second insulating layer and each of the two pixel electrodes; and
  a fourth portion under the second portion of the second insulating layer and being adjacent to the third portion,
 wherein:
  a height from the substrate to a top surface of the fourth portion is greater than a height from the substrate to a top surface of the third portion; and
  a height from the substrate to a top surface of the second portion is greater than a height from the substrate to a top surface of the first portion.

2. The display device of claim 1, wherein the second insulating layer comprises a colored pigment or a carbon black.

3. The display device of claim 1, wherein each of the first insulating layer and the second insulating layer includes a hole corresponding to the transmission area.

4. The display device of claim 1, further comprising at least one inorganic insulating layer between the substrate and the first insulating layer,
wherein the at least one inorganic insulating layer includes a hole corresponding to the transmission area.

5. The display device of claim 1, wherein the first insulating layer comprises a photosensitive organic insulating material.

6. The display device of claim 1, further comprising:
an opposite electrode facing the two pixel electrodes; and
an intermediate layer between each of the two pixel electrodes and the opposite electrode.

7. The display device of claim 6, wherein the opposite electrode includes a hole corresponding to the transmission area.

8. The display device of claim 6, wherein the intermediate layer comprises:
an emission layer overlapping each of the pixel electrodes, and
a functional layer under or over the emission layer.

9. The display device of claim 1, further comprising a back-side metal layer located between the substrate and the two pixel circuits.

10. The display device of claim 9, wherein the back-side metal layer includes a hole corresponding to the transmission area.

11. An electronic apparatus comprising:
a display device comprising a first display area and a second display area comprising a transmission area, wherein a pixel density of the second display area is lower than a pixel density of the first display area; and
a component overlapping at least the transmission area,
wherein the display device comprises:
a substrate;
two pixel circuits located in the second display area and spaced from each other with the transmission area therebetween, each of the two pixel circuits being electrically connected to two pixel electrodes;
a first insulating layer between the two pixel circuits and the two pixel electrodes; and
a second insulating layer on the first insulating layer, the second insulating layer comprising a first portion covering an edge of each of the two pixel electrodes and a second portion adjacent to the first portion,
wherein the first insulating layer comprises:
a third portion under the first portion of the second insulating layer and each of the two pixel electrodes; and
a fourth portion under the second portion of the second insulating layer and being adjacent to the third portion,
wherein:
a height from the substrate to a top surface of the fourth portion is greater than a height from the substrate to a top surface of the third portion; and
a height from the substrate to a top surface of the second portion is greater than a height from the substrate to a top surface of the first portion.

12. The electronic apparatus of claim 11, wherein the second insulating layer comprises a colored pigment or a carbon black.

13. The electronic apparatus of claim 11, wherein the second insulating layer includes a hole corresponding to the transmission area.

14. The electronic apparatus of claim 11, further comprising at least one inorganic insulating layer between the substrate and the first insulating layer,
wherein the at least one inorganic insulating layer includes a hole corresponding to the transmission area.

15. The electronic apparatus of claim 11, wherein the first insulating layer comprises a photosensitive organic insulating material.

16. The electronic apparatus of claim 11, further comprising:
an opposite electrode facing the two pixel electrodes; and
an intermediate layer between each of the two pixel electrodes and the opposite electrode,
wherein the opposite electrode includes a hole corresponding to the transmission area.

17. The electronic apparatus of claim 16, wherein the intermediate layer comprises:
an emission layer overlapping each of the pixel electrodes; and
a functional layer under or over the emission layer.

18. The electronic apparatus of claim 11, further comprising a back-side metal layer located between the substrate and the two pixel circuits.

19. The electronic apparatus of claim 18, wherein the back-side metal layer includes a hole corresponding to the transmission area.

20. The electronic apparatus of claim 11, wherein the component comprises a camera or a sensor using light.

* * * * *